(12) United States Patent
Gupta et al.

(10) Patent No.: US 12,037,686 B2
(45) Date of Patent: Jul. 16, 2024

(54) SELECTIVE CARBON DEPOSITION

(71) Applicant: LAM RESEARCH CORPORATION, Fremont, CA (US)

(72) Inventors: Awnish Gupta, Hillsboro, OR (US); Adrien Lavoie, Newberg, OR (US); Bart J. Van Schravendijk, Palo Alto, CA (US); Samantha SiamHwa Tan, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 104 days.

(21) Appl. No.: 17/622,019

(22) PCT Filed: Jun. 22, 2020

(86) PCT No.: PCT/US2020/038872
§ 371 (c)(1),
(2) Date: Dec. 22, 2021

(87) PCT Pub. No.: WO2020/263718
PCT Pub. Date: Dec. 30, 2020

(65) Prior Publication Data
US 2022/0235464 A1 Jul. 28, 2022

Related U.S. Application Data

(60) Provisional application No. 62/865,566, filed on Jun. 24, 2019.

(51) Int. Cl.
*C23C 16/26* (2006.01)
*C23C 16/455* (2006.01)

(52) U.S. Cl.
CPC ........ *C23C 16/45536* (2013.01); *C23C 16/26* (2013.01); *C23C 16/45534* (2013.01)

(58) Field of Classification Search
CPC .............. C23C 16/26; C23C 16/45534; C23C 16/45536
See application file for complete search history.

(56) References Cited

U.S. PATENT DOCUMENTS 4,975,144 A * 12/1990 Yamazaki ......... H01L 21/32139
216/48
6,091,081 A * 7/2000 Matsubara ........ H01L 21/76834
257/77

(Continued)

FOREIGN PATENT DOCUMENTS

CN 102738074 A 10/2012
JP 7-315990 * 12/1995 ............. C30B 29/04

(Continued)

OTHER PUBLICATIONS

Seth, J., et al., "Plasma deposition and etching of diamond-like carbon films". Applications of Diamond Films and Related Materials; Y. Tzeng, M. Yoshikawa, M. Murakawa, A. Feldman (Editors), 1991, pp. 851-856.*

(Continued)

*Primary Examiner* — Bret P Chen (57) ABSTRACT

A method for depositing carbon on a substrate in a processing chamber includes arranging the substrate on a substrate support in the processing chamber. The substrate includes a carbon film having a first thickness formed on at least one underlying layer of the substrate. The method further includes performing a first etching step to etch the substrate to form features on the substrate, remove portions of the carbon film, and decrease the first thickness of the carbon film, selectively depositing carbon onto remaining portions of the carbon film, and performing at least one second etching step to etch the substrate to complete the forming of the features on the substrate.

15 Claims, 7 Drawing Sheets

(56) References Cited

U.S. PATENT DOCUMENTS

| | | | |
|---|---|---|---|
| 2007/0082483 A1 | 4/2007 | Bai | |
| 2009/0011602 A1* | 1/2009 | Nozawa | H01L 21/02205 |
| | | | 438/694 |
| 2012/0003825 A1* | 1/2012 | Dip | H01L 21/02381 |
| | | | 438/493 |
| 2015/0076580 A1* | 3/2015 | Pachamuthu | H10B 41/20 |
| | | | 257/314 |
| 2016/0035742 A1* | 2/2016 | Kanakamedala | H10B 43/35 |
| | | | 438/264 |
| 2016/0064026 A1* | 3/2016 | Arora | C23C 14/30 |
| | | | 204/192.34 |
| 2016/0126093 A1* | 5/2016 | Dube | H01L 29/7848 |
| | | | 438/481 |
| 2016/0289825 A1* | 10/2016 | Kim | C23C 16/26 |
| 2016/0293405 A1* | 10/2016 | Matsumoto | H01L 21/31116 |
| 2016/0293410 A1* | 10/2016 | Lei | H01L 21/02274 |
| 2016/0329213 A1* | 11/2016 | Tang | C23C 16/26 |
| 2017/0029950 A1* | 2/2017 | Chen | C23C 16/56 |
| 2017/0316935 A1* | 11/2017 | Tan | H01J 37/32183 |
| 2017/0352546 A1 | 12/2017 | Gupta et al. | |
| 2018/0076032 A1 | 3/2018 | Wang et al. | |
| 2018/0337061 A1* | 11/2018 | Leschkies | H01L 21/02274 |
| 2018/0358220 A1* | 12/2018 | Yu | H01J 37/32 |
| 2019/0131140 A1* | 5/2019 | Sun | C09K 13/00 |

FOREIGN PATENT DOCUMENTS

| | | | | |
|---|---|---|---|---|
| KR | 1020070040633 A | | 4/2007 | |
| WO | WO 2014/149281 A1 * | 9/2014 | | H01L 21/31 |

OTHER PUBLICATIONS

Labelle, Catherine B., et al., "Investigation of fluorocarbon plasma deposition from c-C4F8 for use as passivation during deep silicon etching". J. Vac. Sci. Technol. A 22(6), Nov./Dec. 2004, pp. 2500-2507.*

Moses, David, et al., "Plasma Deposition and Etching of Diamond-Like Carbon Films". AIChE Journal, Mar. 1991, vol. 37, No. 3, 367-376.*

Girel, Etienne, et al., "Selective Carbon Deposition on γ-Alumina Acid Sites: toward the Design of Catalyst Supports with Improved Hydrothermal Stability in Aqueous Media". ACS Appl. Mater. Interfaces 2020, 12, 13558-13567.*

Alves, Marco A R, et al., "Selective deposition of amorphous hydrogenated carbon films used as masks for reactive ion etching of Si using CF4". Vacuum 52 (1999) 313-314.*

Terometskaya, I.G., et al., "Selective deposition of various forms of carbon from a gaseous medium". Russian Chemical Bulletin, vol. 33, Aug. 1984, pp. 1724-1726.*

Yang, G.D., et al., "Selective deposition of nanocrystalline carbon films on GaN diodes in photocatalytic reactions". CrystEngComm, 2014, 16, 10097-10102.*

Choi et al., "Hydrogen plasma-enhanced atomic layer deposition of hydrogenated amorphous carbon thin films", Surface & Coatings Technology, 344 (2018), pp. 12-20.

International Search Report and Written Opinion of the ISA issued in PCT/US2020/038872, dated Sep. 28, 2020; ISA/KR.

* cited by examiner

SELECTIVE CARBON DEPOSITION

CROSS-REFERENCE TO RELATED APPLICATIONS

This application is a U.S. National Phase Application under 35 U.S.C. 371 of International Application No. PCT/US2020/038872, filed on Jun. 22, 2020, which claims the benefit of U.S. Provisional Application No. 62/865,566, filed on Jun. 24, 2019. The entire disclosures of the applications referenced above are incorporated herein by reference.

FIELD

The present disclosure relates to selective carbon deposition in an atomic layer deposition substrate processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Examples of substrate treatments include etching, deposition, photoresist removal, etc. During processing, the substrate is arranged on a substrate support such as an electrostatic chuck and one or more process gases may be introduced into the processing chamber.

The one or more processing gases may be delivered by a gas delivery system to the processing chamber. In some systems, the gas delivery system includes a manifold connected by one or more conduits to a showerhead that is located in the processing chamber. In some examples, processes use atomic layer deposition (ALD) to deposit a thin film on a substrate. Various alternating etching and deposition cycles may be performed on a same substrate.

In other features, the at least one underlying layer comprises at least one of silicon, silicon dioxide, and silicon nitride. The substrate includes alternating oxide-nitride (ONON) layers formed on the at least one underlying layer and the carbon film is formed on the ONON layers. Forming the features includes forming ONON pillars in the ONON layers. The carbon film is an amorphous hard mask (AHM) film. The first thickness is less than or equal to 1 µm.

In other features, selectively depositing the carbon includes depositing the carbon using an atomic layer deposition (ALD) process. Performing the ALD process includes supplying at least one carbon-containing precursor gas into the processing chamber in a dosing step first period, purging the processing chamber in a purging step in a second period, and generating plasma in the processing chamber in a plasma step in a third period. Performing the ALD process includes repeatedly alternating the dosing step, the purging step, and the plasma step. Generating the plasma includes generating the plasma while supplying a plasma process gas into the processing chamber without supplying the at least one carbon-containing precursor gas.

In other features, depositing a carbon seed layer on the substrate and depositing the carbon film onto the carbon seed layer. The carbon seed layer comprises carbon fluoride ($CF_x$), wherein x is an integer. Depositing the carbon seed layer includes depositing the carbon seed layer using a CVD or PECVD process. Depositing the carbon seed layer includes supplying a carbon-contain precursor gas into the processing chamber. The carbon-containing precursor gas includes at least one of carbon tetrabromide ($CBr_4$), tribromomethane ($CHBr_3$), and tribromomethane ($CH_2Br_2$).

A system configured to deposit carbon on a substrate in a processing chamber includes a gas delivery system configured to supply process gases into the processing chamber, a radio frequency (RF) plasma generating system configured to generate plasma in the processing chamber, and a controller. The substrate includes a carbon film having a first thickness formed on at least one underlying layer of the substrate. The controller is configured to, with the substrate arranged on a substrate support in the processing chamber, control the RF plasma generating system to perform a first etching step to etch the substrate to form features on the substrate, remove portions of the carbon film, and decrease the first thickness of the carbon film, control the gas delivery system to selectively deposit carbon onto remaining portions of the carbon film, and control the RF plasma generating system to perform at least one second etching step to etch the substrate to complete the forming of the features on the substrate.

In other features, the controller is configured to control the gas delivery system and the RF plasma generating system to perform an atom layer deposition (ALD) process to deposit the carbon. To perform the ALD process, the controller is configured to control the gas delivery system to supply at least one carbon-containing precursor gas into the processing chamber in a dosing step first period, purge the processing chamber in a purging step in a second period, and control the RF plasma generating system to generate plasma in the processing chamber in a plasma step in a third period.

In other features, the controller is configured to control the gas delivery system and the RF plasma generating system to deposit a carbon seed layer on the substrate and deposit the carbon film onto the carbon seed layer. Depositing the carbon seed layer includes supplying a carbon-contain precursor gas into the processing chamber to deposit the carbon seed layer using a CVD or PECVD process. The carbon-containing precursor gas includes at least one of carbon tetrabromide ($CBr_4$), tribromomethane ($CHBr_3$), and tribromomethane ($CH_2Br_2$).

SUMMARY

A method for depositing carbon on a substrate in a processing chamber includes arranging the substrate on a substrate support in the processing chamber. The substrate includes a carbon film having a first thickness formed on at least one underlying layer of the substrate. The method further includes performing a first etching step to etch the substrate to form features on the substrate, remove portions of the carbon film, and decrease the first thickness of the carbon film, selectively depositing carbon onto remaining portions of the carbon film, and performing at least one second etching step to etch the substrate to complete the forming of the features on the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Deposition processes may be used to deposit films (such as amorphous carbon films) on an underlying layer or substrate. In some examples, films may be deposited as a mask to protect features of the substrate during subsequent pattern etching steps. For example, in some patterning processes (e.g., memory hole or other oxide-nitride (ONON) patterning), an amorphous carbon hardmask (AHM) film may be deposited onto the substrate to protect features during an anisotropic etching step.

The AHM film protects tops of features (e.g., ONON pillars or stacks) formed on the substrate during selective etching steps. However, the etching steps also remove material from the AHM film. Accordingly, for deep etching (i.e., for taller ONON stacks), a thickness of the deposited AHM film must be increased to withstand longer etching periods. Increased weight associated with the thicker AHM film may cause bowing of the substrate and/or ONON features. In other examples, a photoresist film may be used to define a pitch of the pattern. However, when the photoresist film is used, further reducing the pitch may be difficult.

Systems and methods according to the present disclosure selectively deposit carbon (e.g., using atomic layer deposition, or ALD) onto a previously deposited carbon film. For example, the carbon film may be deposited on a substrate or underlying layer comprising silicon (Si), silicon dioxide ($SiO_2$), silicon nitride (SiN), etc. using chemical vapor deposition (CVD) and/or, in some examples, may be incidentally deposited as a result of etching a carbon-containing film in a previous step. Subsequent to a first etching period, carbon may be redeposited onto the carbon film in a selective carbon growth step (e.g., using ALD). For example, the selective carbon growth step may only deposit carbon onto the remaining portion of the previously deposited carbon film and not onto other (e.g., Si, $SiO_2$, SiN, etc.) features. Any nominal amounts of carbon deposited onto other surfaces may be removed by isotropic etching. Additional deposition of carbon may be performed as needed. For example, alternating carbon deposition steps and etching steps may be performed. In this manner, an amount of etching protection provided by the carbon film may be extended for additional etching periods without increasing an initial thickness of a deposited AHM film.

Figure 1:
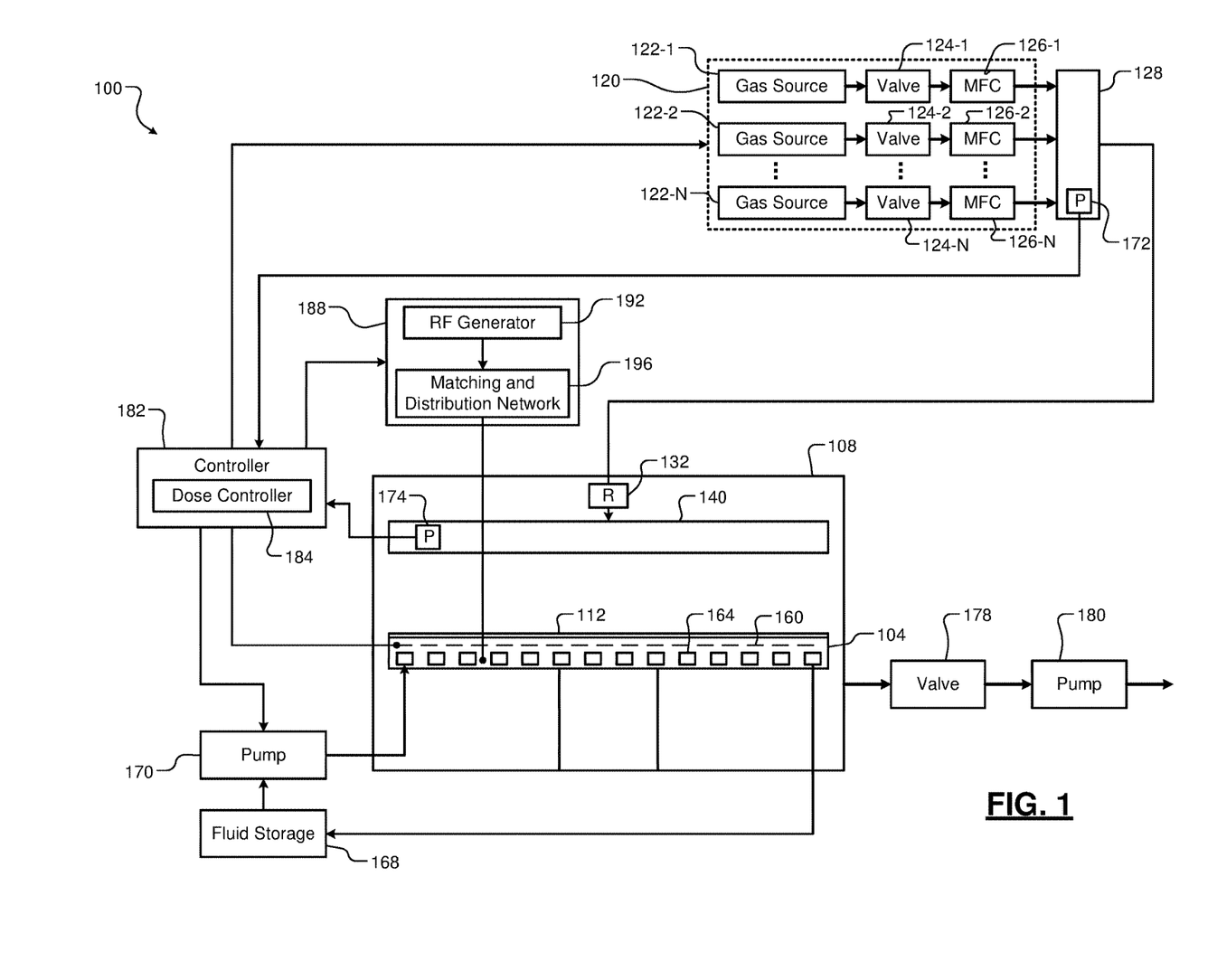
FIG. 1 is a functional block diagram of an example of a substrate processing system according to the present disclosure.

Referring now to FIG. 1, an example substrate processing system 100 configured to perform selective carbon deposition according to the principles of the present disclosure is shown. The substrate processing system 100 includes a substrate support (e.g., a pedestal) 104 arranged within a processing chamber 108. A substrate 112 is arranged on the substrate support 104 for processing. For example, processing including deposition and etching steps may be performed on the substrate 112.

A gas delivery system 120 is configured to flow process gases into the processing chamber 108. For example, the gas delivery system 120 includes gas sources 122-1, 122-2, ..., and 122-N (collectively gas sources 122) that are connected to valves 124-1, 124-2, ..., and 124-N (collectively valves 124) and mass flow controllers 126-1, 126-2, ..., and 126-N (collectively MFCs 126). The MFCs 126 control flow of gases from the gas sources 122 to a manifold 128 where the gases mix. An output of the manifold 128 is supplied via an optional pressure regulator 132 to a gas distribution device such as a multi-injector showerhead 140.

In some examples, a temperature of the substrate support 104 may be controlled using resistive heaters 160. The substrate support 104 may include coolant channels 164. Cooling fluid is supplied to the coolant channels 164 from a fluid storage 168 and a pump 170. Pressure sensors 172, 174 may be arranged in the manifold 128 or the showerhead 140, respectively, to measure pressure. A valve 178 and a pump 180 may be used to evacuate reactants from the processing chamber 108 and/or to control pressure within the processing chamber 108.

A controller 182 controls gas delivery from the gas delivery system 120. In some examples, the controller 182 may include a dose controller 184 that controls dosing provided by the multi-injector showerhead 140. The controller 182 controls pressure in the processing chamber and/or evacuation of reactants using the valve 178 and the pump 180. The controller 182 controls the temperature of the substrate support 104 and the substrate 112 based upon temperature feedback (e.g., from sensors (not shown) in the substrate support and/or sensors (not shown) measuring coolant temperature). The controller 182 according to the present disclosure is configured to control the gas delivery system 120 to perform selective carbon deposition as described below in more detail.

In some examples, the substrate processing system 100 may be configured to perform etching (e.g., responsive to the controller 182) on the substrate 112 within the same processing chamber 108. Accordingly, the substrate processing system 100 may include an RF generating system 188 configured to generate and provide RF power (e.g., as a voltage source, current source, etc.) to one of a lower electrode (e.g., a baseplate of the substrate support 104, as shown) and an upper electrode (e.g., the showerhead 140). The other one of the lower electrode and the upper electrode may be DC grounded, AC grounded, or floating. For example only, the RF generating system 188 may include an RF generator 192 configured to generate an RF voltage that is fed by a matching and distribution network 196 to generate plasma within the processing chamber 108 to etch the substrate 112. In other examples, the plasma may be generated inductively or remotely. Although, as shown for example purposes, the RF generating system 188 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

Figure 2A:
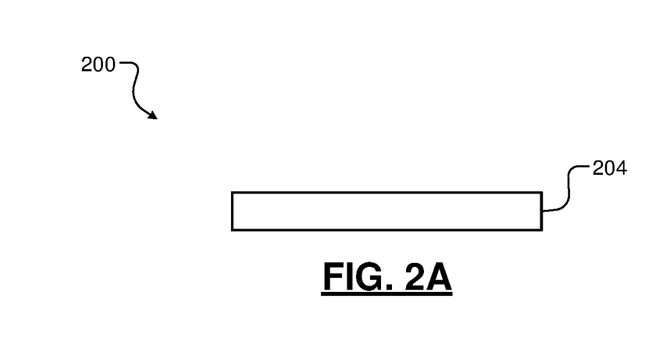
FIGS. 2A, 2B, 2C, and 2D show an example carbon mask deposition process.
Figure 2B:
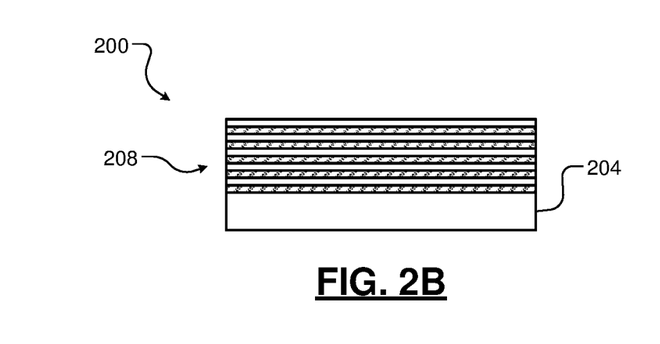
Figure 2C:
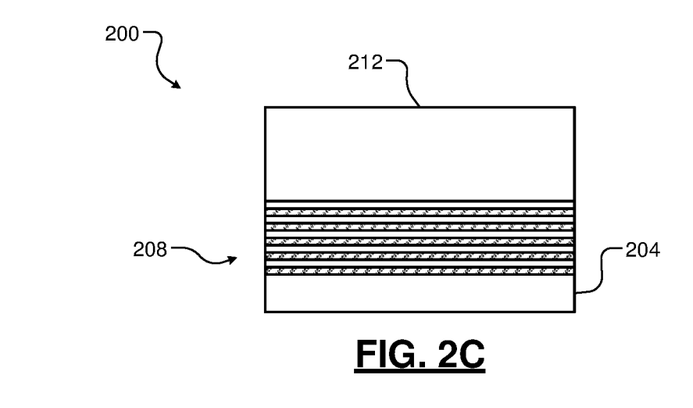
Figure 2D:
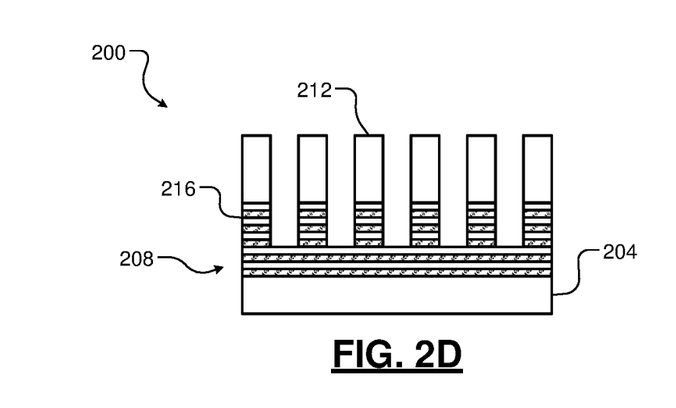

Referring now to FIGS. 2A, 2B, 2C, and 2D, an example carbon mask deposition process is shown. FIG. 2A shows an example substrate 200 provided for processing. For example, the substrate 200 may include one or more underlying layers 204. The underlying layers 204 may comprise Si, $SiO_2$, SiN, etc. FIG. 2B shows alternating ONON layers 208 deposited on the underlying layers 204. FIG. 2C shows an AHM layer 212 (e.g., a carbon AHM film) deposited on the ONON layers 208. FIG. 2D shows ONON features 216 (e.g., ONON pillars or stacks) formed by etching the ONON layers 208. The AHM layer 212 protects tops of the ONON features 216 formed during selective etching steps. As shown, the initial AHM layer 212 is sufficiently thick (e.g., greater than 2 µm) to withstand etching until the etching of the ONON features 216 is completed.

Figure 3A:
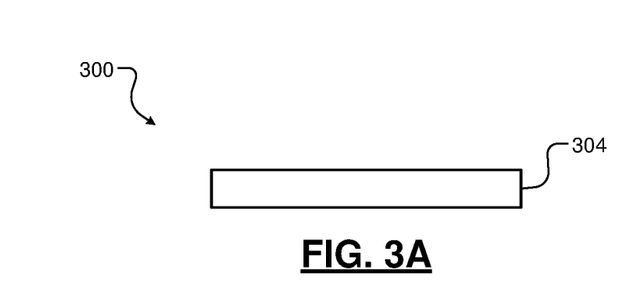
FIGS. 3A, 3B, 3C, 3D, 3E, and 3F show an example selective carbon deposition process according to the present disclosure.
Figure 3B:
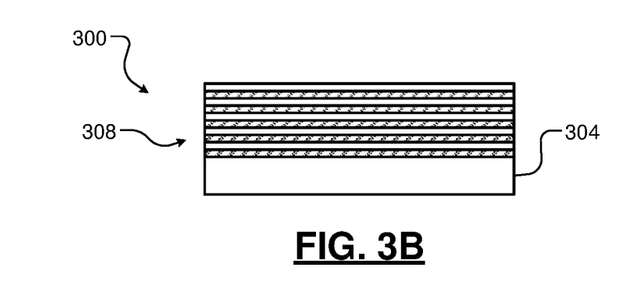

Referring now to FIGS. 3A, 3B, 3C, 3D, 3E, and 3F, an example selective carbon deposition process according to the present disclosure is shown. FIG. 3A shows an example substrate 300 provided for processing. For example, the substrate 300 may include one or more underlying layers 304. The underlying layers 304 may comprise Si, $SiO_2$, SiN, etc. FIG. 3B shows alternating ONON layers 308 deposited on the underlying layers 304.

Figure 3C:
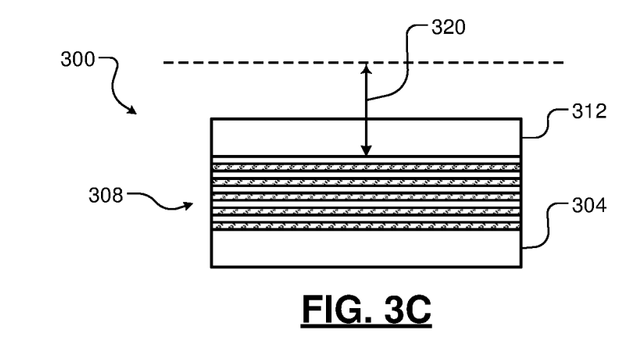
Figure 3D:
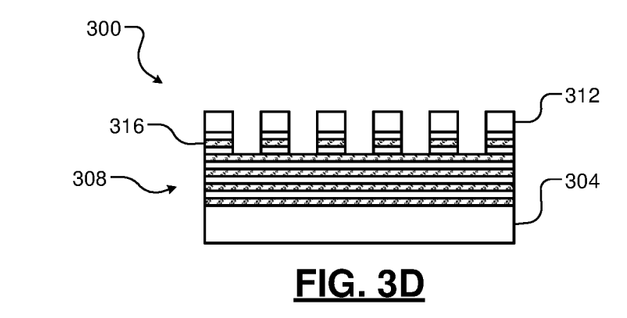

FIG. 3C shows an AHM layer 312 (e.g., a carbon AHM film) deposited on the ONON layers 308 (e.g., using a CVD or plasma enhanced CVD (PECVD) process). In this example, a thickness of the AHM layer 312 is significantly less than a thickness of the AHM layer 212 shown in FIG. 2C (and as indicated at 320). For example, the thickness of the AHM layer 312 may be 50% or less than a thickness of the AHM layer 212 (e.g., 1 µm or less). FIG. 3D shows ONON features 316 formed by etching the ONON layers 308. The AHM layer 312 protects tops of the ONON features 316 formed during selective etching steps.

Figure 3E:
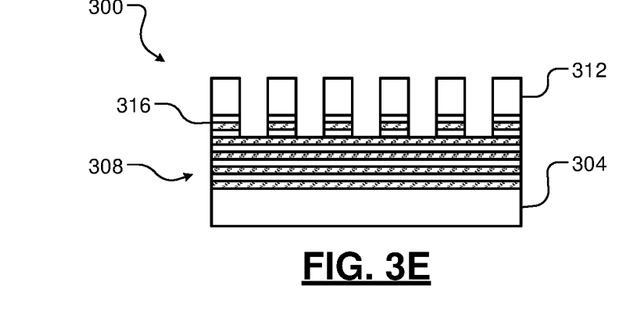

FIG. 3E shows additional carbon material redeposited onto the AHM layer 312 (e.g., using an ALD process as described below in more detail). In other words, subsequent to the initial etching performed in FIG. 3D and prior to completing the etching of the ONON features 316, carbon is selectively redeposited onto the AHM layer 312 to increase the thickness of the AHM layer 312. For example, carbon is selectively redeposited in a selective carbon growth step such that carbon is deposited onto remaining portions of the AHM layer 312 without being deposited onto the ONON features 316 or the ONON layers 308. Any carbon deposited onto the ONON features 316 or the ONON layers 308 may be removed in subsequent anisotropic etching steps.

Figure 3F:
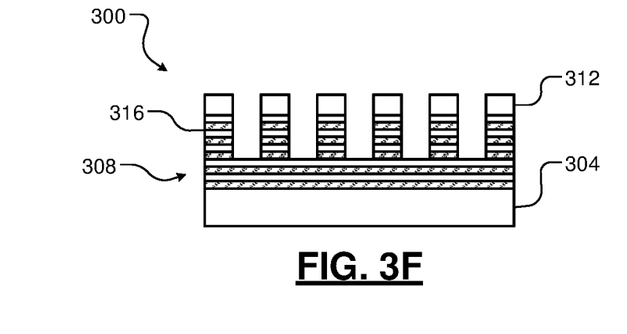

In this manner, the thickness of the AHM layer 312 is increased to compensate for material lost during etching. FIG. 3F shows the ONON features 316 subsequent to additional etching. The alternating redepositing of the carbon on the AHM layer 312 and the etching of the ONON features 316 as described in FIGS. 3E and 3F may be repeated as necessary to complete the etching of the ONON features 316 to a desired depth.

In one example, an ALD process is performed to selectively deposit the carbon of the AHM layer 312 by providing a dose of one or more carbon precursor gases (e.g., precursors including hydrocarbon species ($C_xH_y$), such acetylene, or $C_2H_2$, gas) into the processing chamber 108 in a dosing step for a first period (e.g., for 5-20 seconds). A purging step (e.g., using argon, or Ar, gas) may be performed in a subsequent second period (e.g., for 1-10 seconds). An RF plasma step is performed in a third period (e.g., from 0.1 to 1.0 second) subsequent to the purging step. A plasma process gas (e.g., Ar gas) may be provided while the precursor gases are not provided during the RF plasma step. In other words, plasma may be generated in the processing chamber 108 while the Ar gas is being flowed but without providing additional precursor gases subsequent to the purging step. Accordingly, relatively small amounts of carbon (e.g., 1-2 angstroms) are deposited during the RF plasma step. A second purging step may be performed in a fourth period (e.g., from 1 to 10 seconds) to purge byproducts from the processing chamber 108.

The dosing, purging, and RF plasma steps may be repeated multiple times (e.g., for 200-300 cycles) to selectively deposit carbon as shown in FIGS. 3C and 3E. In some examples, this selective carbon deposition process results in deposition of 30-50 nm of carbon on the AHM layer 312 while only 0-3.0 nm of carbon is deposited on Si, $SiO_2$, or SiN layers.

Figure 4A:
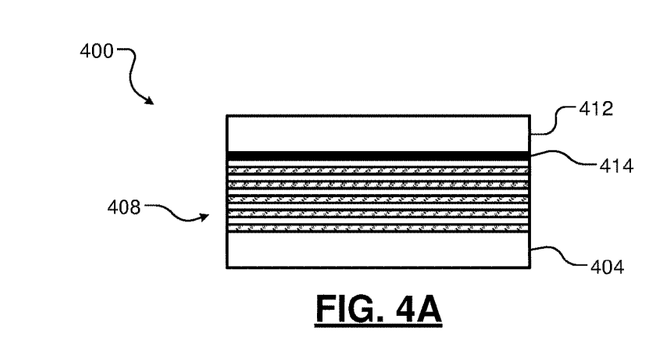
FIGS. 4A, 4B, 4C, 4D, and 4E show another example selective carbon deposition process according to the present disclosure.

FIGS. 4A, 4B, 4C, 4D, and 4E show another example selective carbon deposition process according to the present disclosure. In this example, a carbon nucleation or seed layer is deposited and additional carbon material is selectively deposited onto the carbon seed layer (e.g., using ALD). FIG. 4A shows an example substrate 400 including one or more underlying layers 404 (e.g., Si, $SiO_2$, SiN, etc.), alternating ONON layers 408 deposited on the underlying layers 404, and an AHM layer 412 (e.g., a carbon AHM film) deposited on the ONON layers 408. For example, a carbon seed layer 414 is deposited on the ONON layers 408 and the AHM layer 412 is deposited on the carbon seed layer 414. In some examples, the carbon seed layer 414 may correspond to a $CF_x$ layer conformally deposited onto the ONON layers 408. The carbon of the AHM layer 412 selectively deposits onto the $CF_x$ layer.

In some examples, the carbon seed layer 414 may be deposited using a CVD or PECVD process. The carbon seed layer 414 may have a thickness of 0.5 to 2 angstroms. In one example, a carbon bromide precursor gas (e.g., carbon tetrabromide, or $CBr_4$) is flowed into the processing chamber 108 to deposit the carbon seed layer 414. Other example precursor gases include, but are not limited to, tribromomethane ($CHBr_3$) and tribromomethane ($CH_2Br_2$).

In some examples, carbon is selectively deposited (e.g., using ALD) on the carbon seed layer 414 to form the AHM layer 412 by flowing a $C_2H_2$ precursor gas into the processing chamber 108 and generating plasma in an RF plasma step. For example, a plasma process gas such as Ar gas may be provided during the RF plasma step to cause selective deposition of carbon onto the carbon seed layer 414. Optional purging steps may be performed prior and/or subsequent to performing the selective carbon deposition in a manner similar to that described in FIGS. 3A-3F.

Figure 4B:
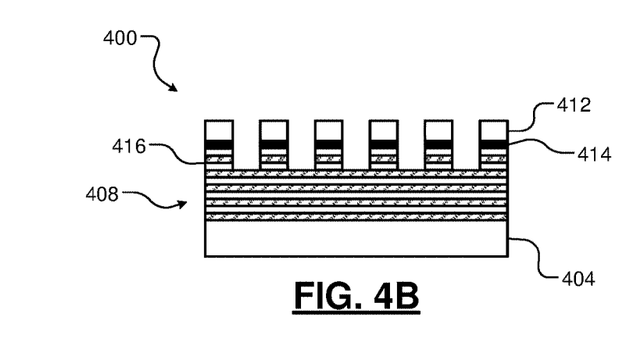
Figure 4C:
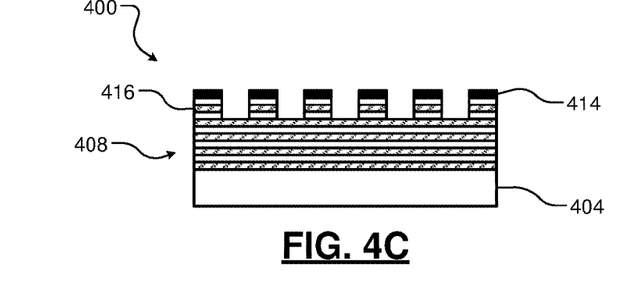
Figure 4D:
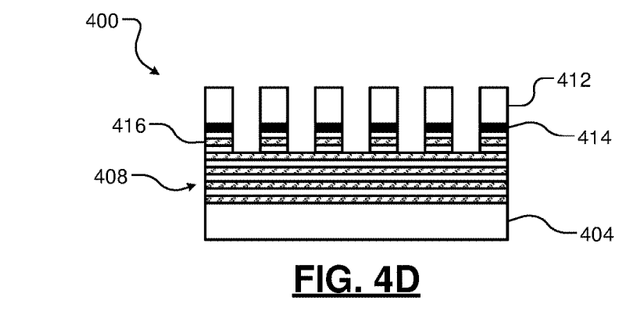

FIG. 4B shows ONON features 416 formed by etching the ONON layers 408. The AHM layer 412 protects tops of the ONON features 416 formed during selective etching steps. FIG. 4C shows an example where the etching has removed the AHM layer 412 down to the carbon seed layer 414. FIG. 4D shows additional carbon material deposited onto the carbon seed layer 414 to reform the AHM layer 412. In other words, subsequent to the initial etching performed in FIG. 4B and prior to completing the etching of the ONON features 416, carbon is selectively redeposited onto the carbon seed layer 414 to increase the thickness of the AHM layer 312. For example, carbon is selectively redeposited in a selective carbon growth step (e.g., using ALD) such that carbon is deposited onto the carbon seed layer 414 and/or remaining portions of the AHM layer 412 without being deposited onto the ONON features 416 or the ONON layers 408. Any carbon deposited onto the ONON features 416 or the ONON layers 408 may be removed in subsequent anisotropic etching steps.

Figure 4E:
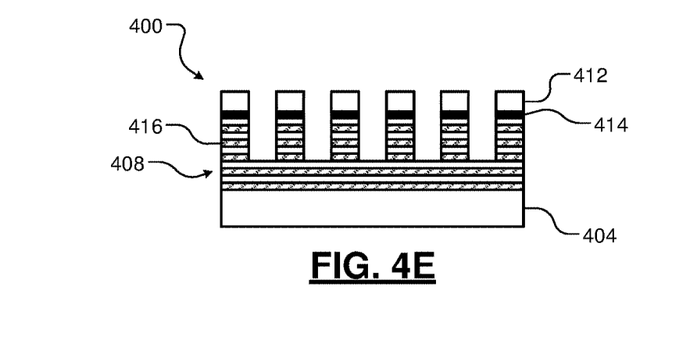

FIG. 4E shows the ONON features 416 subsequent to additional etching. The alternating redepositing of the carbon on the carbon seed layer 414 and/or the AHM layer 412 and the etching of the ONON features 416 as described in FIGS. 4D and 4F may be repeated as necessary to complete the etching of the ONON features 416 to a desired depth.

Figure 5A:
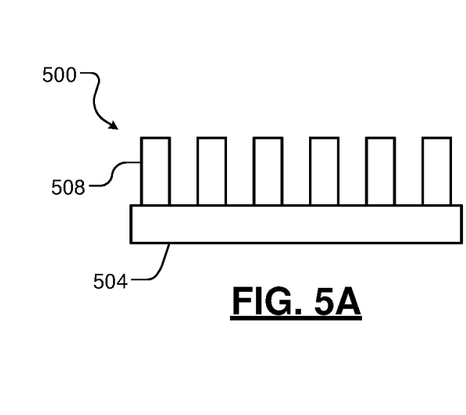
FIGS. 5A, 5B, and 5C show an example conformal carbon ALD process according to the present disclosure.
Figure 5B:
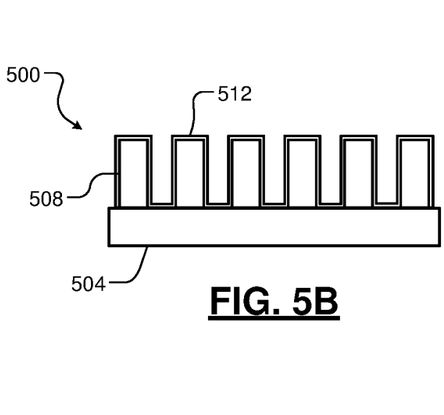
Figure 5C:
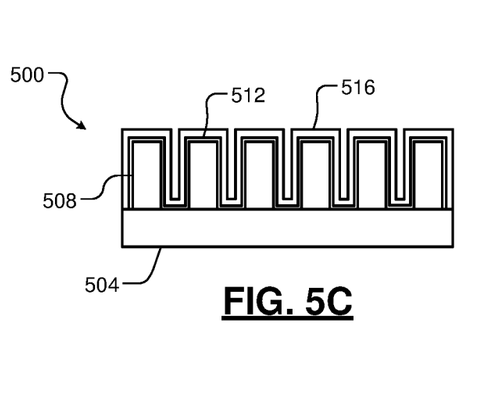

FIGS. 5A, 5B, and 5C show an example conformal carbon ALD process according to the present disclosure. FIG. 5A shows an example substrate 500 including one or more underlying layers 504 and pattern features (e.g., stacks or pillars) 508 formed on the underlying layers. The underlying layers 504 may comprise Si, $SiO_2$, SiN, etc. For example only, the pattern features 508 may correspond to features comprising silicon, silicon nitride, silicon oxide, ONON layers, etc.

FIG. 5B shows a carbon seed layer 512 deposited on the pattern features 508. For example, carbon seed layer 512 may correspond a layer deposited using a PECVD process. In one example, the PECVD process includes flowing one or more precursor gases (e.g., $CBr_4$) into the processing chamber 108 and generating plasma while additionally flowing a plasma process gas such as helium (He), molecular hydrogen ($H_2$), etc.

FIG. 5C shows a conformal carbon ALD layer 516 formed on the carbon seed layer 512. For example, the conformal carbon ALD layer 516 is formed by selectively depositing carbon onto the carbon seed layer 512. For example, carbon is selectively deposited on the carbon seed layer 512 by flowing a hydrocarbon precursor such as $C_2H_2$ gas into the processing chamber 108 and generating plasma in an RF plasma step. For example only, a plasma process gas such as Ar gas may be provided during the RF plasma step to cause selective deposition of carbon onto the carbon seed layer 512.

Figure 6A:
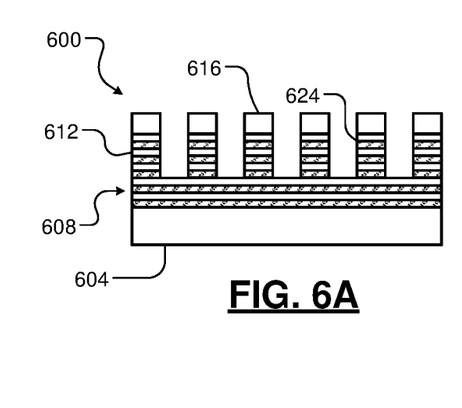
FIGS. 6A, 6B, and 6C show an example process for depositing a carbon protection layer according to the present disclosure.
Figure 6B:
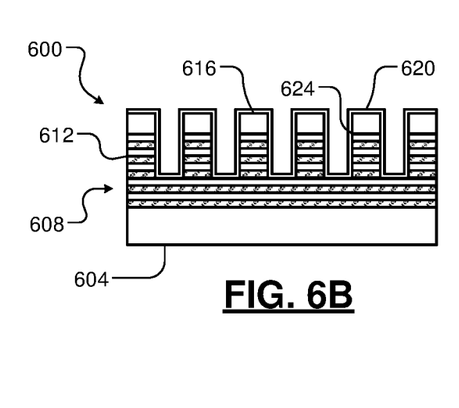
Figure 6C:
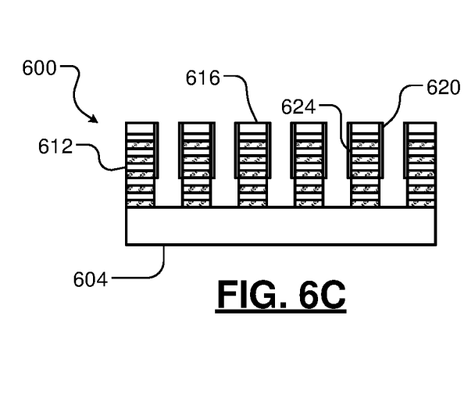

FIGS. 6A, 6B, and 6C show an example process for depositing a carbon protection layer according to the present disclosure. FIG. 6A shows an example substrate 600 including one or more underlying layers 604, ONON layers 608 formed on the underlying layers 604, and ONON features 612 previously etched into the ONON layers 608. The underlying layers 504 may comprise Si, $SiO_2$, SiN, etc. As shown, remaining portions of a carbon mask layer (e.g., a carbon AHM, a metal-doped diamond-like carbon (MDLC) layer, etc.) 616 may be formed on the ONON features 612. The carbon mask layer 616 protects upper surfaces of the ONON features 612 during etching.

FIG. 6B shows a conformal carbon protection layer 620 selectively deposited on the carbon mask layer 616, upper surfaces of the ONON layers 608, and sidewalls 624 of the ONON features 612. For example, the carbon protection layer 620 may correspond to a layer deposited using an ALD process. In one example, the ALD process includes flowing one or more precursor gases (e.g., $CBr_4$) into the processing chamber 108 and generating plasma while additionally flowing a plasma process gas such as helium (He), molecular hydrogen ($H_2$), etc. to conformally deposit the carbon protection layer 620. In other examples, the carbon protection layer 620 is not deposited in a separate step. Rather, the carbon protection layer 620 may be formed by material from the carbon mask layer 616 being redeposited during etching steps.

FIG. 6C shows the ONON features 612 subsequent to additional etching. Portions of the carbon protection layer 620 protecting the sidewalls 624 of the ONON features 612 were etched. Accordingly, the carbon protection layer 620 as shown in FIG. 6C is thinner relative to FIG. 6B. The carbon protection layer 620 may be redeposited for additional etching steps. In this manner, alternating deposition of the carbon protection layer 620 and etching steps may be repeated until etching of the ONON features 612 is completed.

Figure 7A:
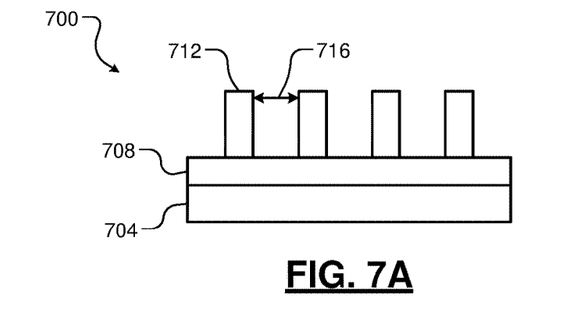
FIGS. 7A and 7B show an example process for reducing a pitch of features formed on a substrate according to the present disclosure.
Figure 7B:
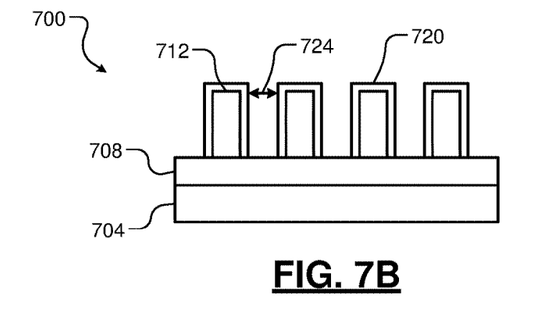

FIGS. 7A and 7B show an example process for reducing a pitch of features formed on a substrate 700 according to the present disclosure. FIG. 7A shows an example of the substrate 700 including one or more underlying layers such as an AHM 704, an etch stop layer (ESL) 708, etc. and pattern features (e.g., mandrels or spacers) 712 formed on the underlying layers. The mandrels 712 may comprise any suitable sacrificial material (e.g., Si, $SiO_2$, etc.) that may be removed in subsequent etching steps. The mandrels 712 are spaced according to a pitch 716.

FIG. 7B shows a conformal carbon layer 720 selectively deposited onto the mandrels 712. For example, the conformal carbon layer 720 may correspond to a layer deposited using an ALD process as described above in other examples. The conformal carbon layer 720 reduces the spacing between the mandrels 712 to form new reduced pitch 724.

Figure 8A:
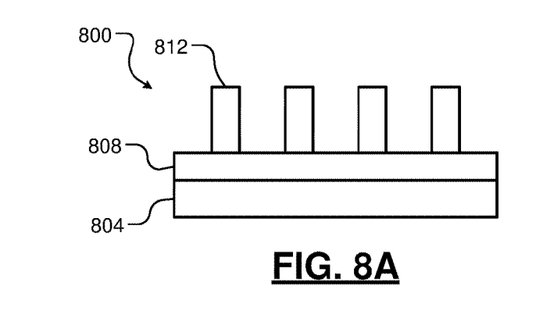
FIGS. 8A, 8B, 8C, and 8D show an example double patterning process using conformal carbon deposition according to the present disclosure.

FIGS. 8A, 8B, 8C, and 8D show an example double patterning process using conformal carbon deposition according to the present disclosure. FIG. 8A shows an example of a substrate 800 including one or more underlying layers 804, a buffer layer (e.g., an SiN or $SiN_2$ layer) 808, and pattern features (e.g., mandrels or spacers) 812 formed on the underlying layers. The mandrels 812 may comprise any suitable sacrificial material (e.g., Si, $SiO_2$, etc.) that may be removed in subsequent etching steps.

Figure 8B:
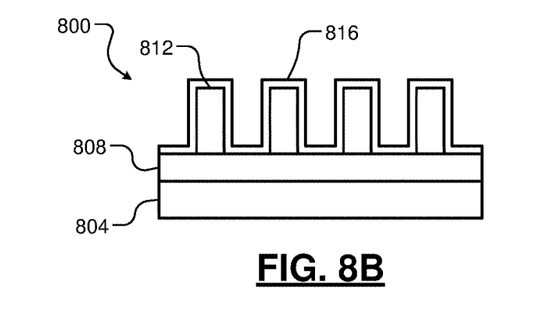
Figure 8C:
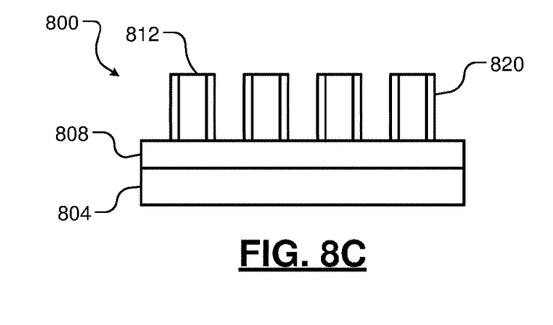

FIG. 8B shows a conformal (e.g., amorphous) carbon layer 816 selectively deposited onto the mandrels 812. For example, the conformal carbon layer 816 may correspond to a layer deposited using an ALD process as described above in other examples. As shown in FIG. 8C, the conformal carbon layer 816 can then be selectively etched (i.e., relative to $SiO_2$, $SiN_2$, etc.) from the buffer layer 808 and upper surfaces of the mandrels 812 while sidewalls (e.g., sidewall spacers) 820 of the carbon layer 816 remain on the substrate 800. In some examples, etching of the carbon layer 816 includes one or more ashing steps.

Figure 8D:
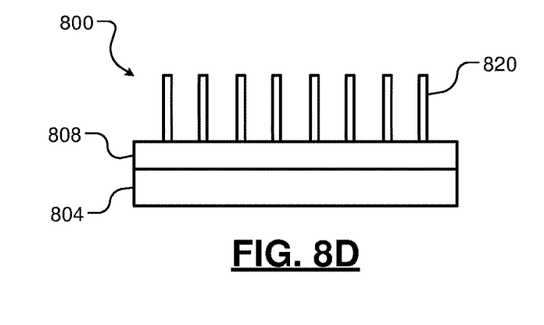

As shown in FIG. 8D, additional etching steps are performed to remove the mandrels 812 from between the sidewall spacers 820. The sidewall spacers 820 remain on the substrate 800 for additional processing steps.

In addition to the examples provided above, conformal carbon deposition may be used for other semiconductor processing steps. For example, a PECVD or other ALD process may be used to conformally deposit carbon on a substrate to fill (i.e., gap fill) voids in the substrate.

Figure 9:
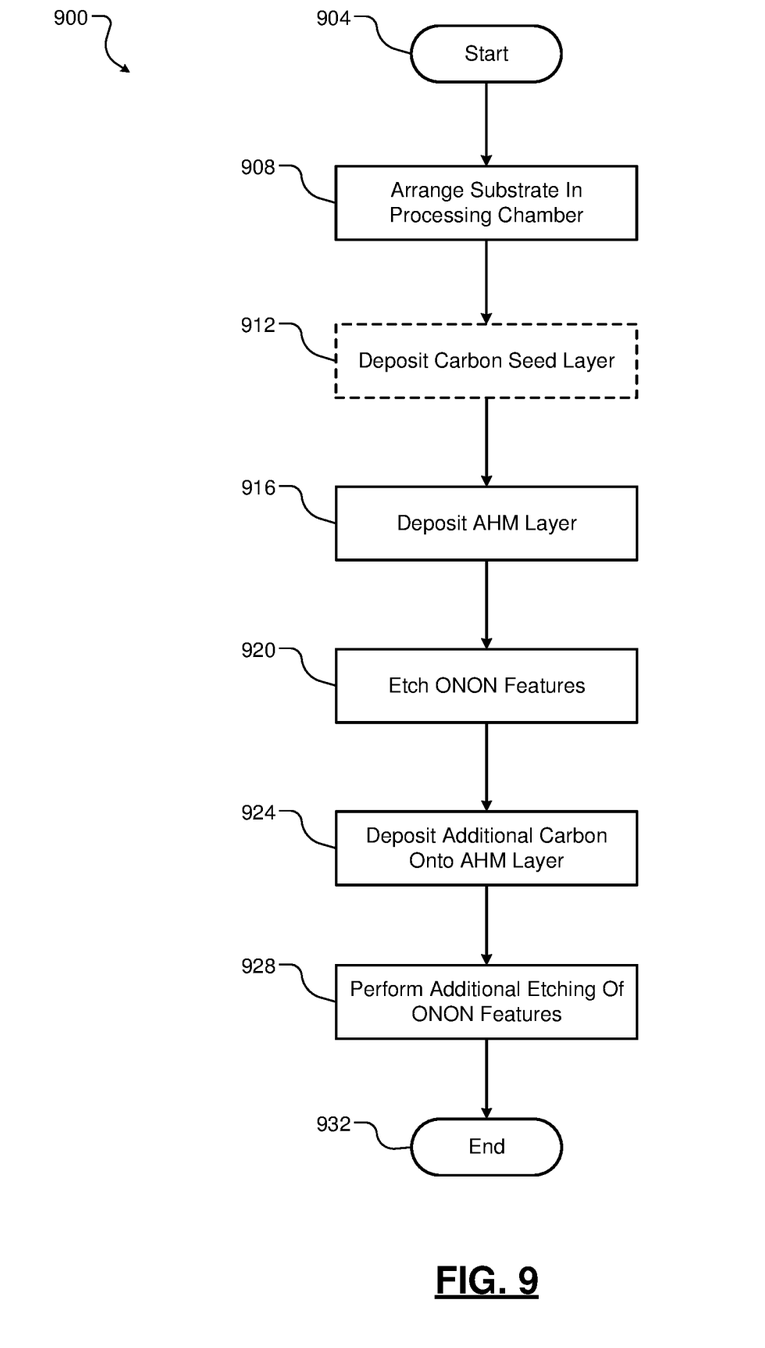
FIG. 9 illustrates steps of an example method of performing a selective carbon deposition process according to the present disclosure.

Referring now to FIG. 9, an example method 900 of performing a selective carbon deposition process according to the present disclosure begins at 904. At 908, a substrate is arranged in a processing chamber. For example, the substrate may include one or more underlying layers and alternating ONON layers deposited on the underlying layers. At 912, an optional carbon nucleation or seed layer is deposited onto the ONON layers. At 916, an AHM layer (e.g., a carbon AHM film) is deposited onto the ONON layers (and/or onto the carbon seed layer). At 920, ONON features (e.g., stacks or pillars) are formed by etching the ONON layers.

At 924, additional carbon material is selectively deposited onto the AHM layer to replace material removed during the etching step (e.g., using an ALD process). In one example, the selective carbon deposition of the AHM layer is performed by providing a dose of one or more carbon precursor gases (e.g., acetylene, or $C_2H_2$, gas) into the processing chamber in a dosing step for a first period (e.g., for 5-20 seconds). A purging step (e.g., using argon, or Ar, gas) may be performed in a subsequent second period (e.g., for 1-10 seconds). An RF plasma step is performed in a third period (e.g., from 0.1 to 1.0 second) subsequent to the purging step. A second purging step may be performed in a fourth period (e.g., from 1 to 10 seconds) to purge byproducts from the processing chamber. The dosing, purging, and RF plasma steps may be repeated multiple times to selectively deposit a desired amount of carbon.

At 928, additional etching is performed to complete the ONON features. The alternating redepositing of the carbon on the AHM layer and the etching of the ONON features performed at 924 and 928 may be repeated as necessary to complete the etching of the ONON features to a desired depth. The method 900 ends at 932.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing carbon on a substrate in a processing chamber, the method comprising:
   arranging the substrate on a substrate support in the processing chamber, wherein the substrate includes a carbon film having a first thickness formed on at least one underlying layer of the substrate;
   performing a first etching step to etch the substrate to form features on the substrate, wherein performing the first etching step removes portions of the carbon film and decreases the first thickness of the carbon film;
   selectively depositing carbon onto only remaining portions of the carbon film, without depositing carbon onto the features on the substrate and the at least one underlaying layer of the substrate; and
   performing at least one second etching step to etch the substrate to complete the forming of the features on the substrate.

2. The method of claim 1, wherein the at least one underlying layer comprises at least one of silicon, silicon dioxide, and silicon nitride.

3. The method of claim 1, wherein the substrate includes alternating oxide-nitride (ONON) layers formed on the at least one underlying layer and the carbon film is formed on the ONON layers.

4. The method of claim 3, wherein forming the features includes forming ONON pillars in the ONON layers.

5. The method of claim 1, wherein the carbon film is an amorphous hard mask (AHM) film.

6. The method of claim 1, wherein the first thickness is less than or equal to 1 pill.

7. The method of claim 1, wherein selectively depositing the carbon includes depositing the carbon using an atomic layer deposition (ALD) process.

8. The method of claim 7, wherein performing the ALD process includes supplying at least one carbon-containing precursor gas into the processing chamber in a dosing step first period, purging the processing chamber in a purging step in a second period, and generating plasma in the processing chamber in a plasma step in a third period.

9. The method of claim 8, wherein performing the ALD process includes repeatedly alternating the dosing step, the purging step, and the plasma step.

10. The method of claim 8, wherein generating the plasma includes generating the plasma while supplying a plasma process gas into the processing chamber without supplying the at least one carbon-containing precursor gas.

11. The method of claim 1, further comprising depositing a carbon seed layer on the substrate and depositing the carbon film onto the carbon seed layer.

12. The method of claim 11, wherein the carbon seed layer comprises carbon fluoride ($CF_x$), wherein x is an integer.

13. The method of claim 11, wherein depositing the carbon seed layer includes depositing the carbon seed layer using a CVD or PECVD process.

14. The method of claim 11, wherein depositing the carbon seed layer includes supplying a carbon containing precursor gas into the processing chamber.

15. The method of claim 14, wherein the carbon-containing precursor gas includes at least one of carbon tetrabromide ($CBr_4$), tribromomethane ($CHBr_3$), and tribromomethane ($CH_2Br_2$).

* * * * *